(12) United States Patent
Brandes et al.

(10) Patent No.: US 8,596,821 B2
(45) Date of Patent: Dec. 3, 2013

(54) LED LIGHT BULBS

(75) Inventors: George R. Brandes, Raleigh, NC (US);
Julio A. Garceran, Cary, NC (US)

(73) Assignee: Cree, Inc., Durham, NC (US)

( * ) Notice: Subject to any disclaimer, the term of this patent is extended or adjusted under 35 U.S.C. 154(b) by 482 days.

(21) Appl. No.: 12/796,555

(22) Filed: Jun. 8, 2010

(65) Prior Publication Data

US 2011/0298371 A1 Dec. 8, 2011

(51) Int. Cl.
*F21V 21/00* (2006.01)

(52) U.S. Cl.
USPC ............ 362/249.02; 362/249.01; 362/311.02; 362/800

(58) Field of Classification Search
USPC ................ 362/249.01, 249.02, 249.14, 294, 362/311.02, 373, 800
See application file for complete search history.

(56) References Cited

U.S. PATENT DOCUMENTS

| | | | |
|---|---|---|---|
| 6,465,961 B1 | 10/2002 | Cao | |
| 6,634,770 B2 | 10/2003 | Cao | |
| 6,746,885 B2 | 6/2004 | Cao | |
| 6,793,374 B2 | 9/2004 | Begemann | |
| 7,026,756 B2 | 4/2006 | Shimizu et al. | |
| 7,086,756 B2 | 8/2006 | Maxik | |
| 7,224,001 B2 | 5/2007 | Cao | |
| 7,726,836 B2 | 6/2010 | Chen | |
| 2005/0068776 A1 | 3/2005 | Ge et al. | |
| 2005/0243539 A1 | 11/2005 | Evans et al. | |
| 2006/0215422 A1 | 9/2006 | Laizure, Jr. et al. | |
| 2007/0263405 A1 | 11/2007 | Ng et al. | |
| 2007/0267976 A1 | 11/2007 | Bohler et al. | |
| 2008/0218992 A1 | 9/2008 | Li | |
| 2008/0218993 A1 | 9/2008 | Li | |
| 2009/0016062 A1 | 1/2009 | Lee et al. | |
| 2009/0080187 A1 | 3/2009 | Chou | |
| 2009/0302730 A1 | 12/2009 | Carroll et al. | |
| 2010/0073944 A1 | 3/2010 | Chen | |
| 2011/0141698 A1 | 6/2011 | Chiou et al. | |
| 2011/0234081 A1 | 9/2011 | Adams | |
| 2011/0298350 A1 | 12/2011 | van de Ven | |
| 2011/0298355 A1 | 12/2011 | van de Ven | |

FOREIGN PATENT DOCUMENTS

| | | |
|---|---|---|
| JP | 2001-291406 A | 10/2001 |
| JP | 2004-111355 A | 4/2004 |
| KR | 10-2010-0037354 A | 4/2010 |
| WO | WO-0034709 A1 | 6/2000 |
| WO | 2004100213 A1 | 11/2004 |
| WO | 2008/093978 A1 | 8/2008 |
| WO | 2008134056 A2 | 11/2008 |

OTHER PUBLICATIONS

U.S. Appl. No. 12/730,082.
International Search Report issued in International Patent Application No. PCT/US2011/038454 on Nov. 23, 2011.
Unpublished U.S. Appl. No. 12/794,559.
Unpublished U.S. Appl. No. 12/796,549.

*Primary Examiner* — Stephen F Husar
*Assistant Examiner* — Meghan Dunwiddie
(74) *Attorney, Agent, or Firm* — Vincent K. Gustafson; Jenkins, Wilson, Taylor & Hunt, P.A.

(57) ABSTRACT

LED light bulbs include openings in base or cover portions, and optional forced flow elements, for convective cooling. Thermally conductive optically transmissive material may be used for cooling, optionally including fins. A LED light engine may be fabricated from a substrate via planar fabrication techiques and shaped to form a substantially rigid upright support structure. Mechanical, electrical, and thermal connections may be made between a LED light engine and a LED light bulb.

57 Claims, 6 Drawing Sheets

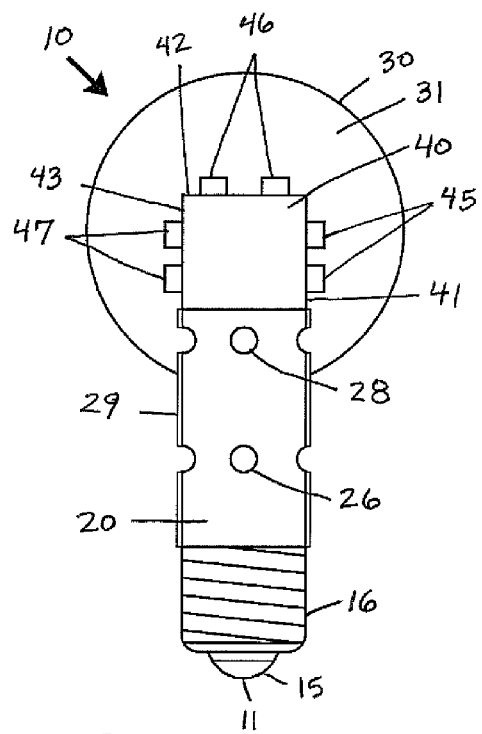
FIG._1
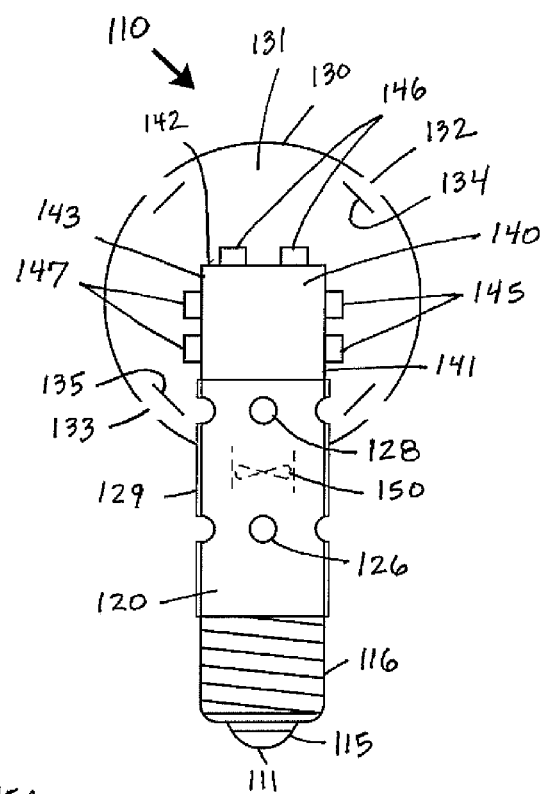
FIG._3
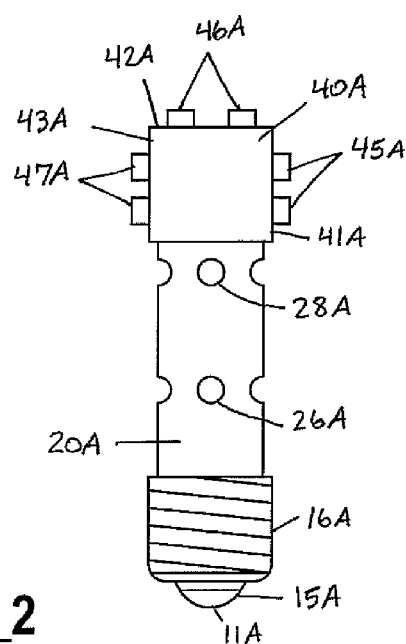
FIG._2

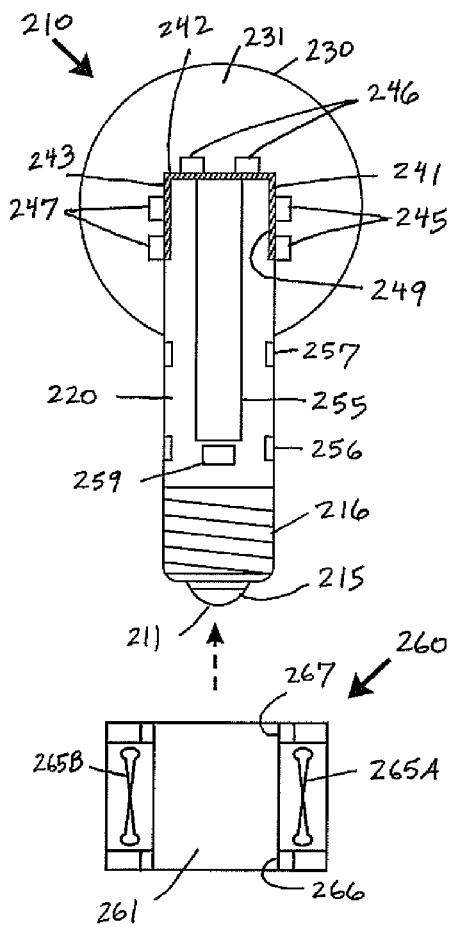
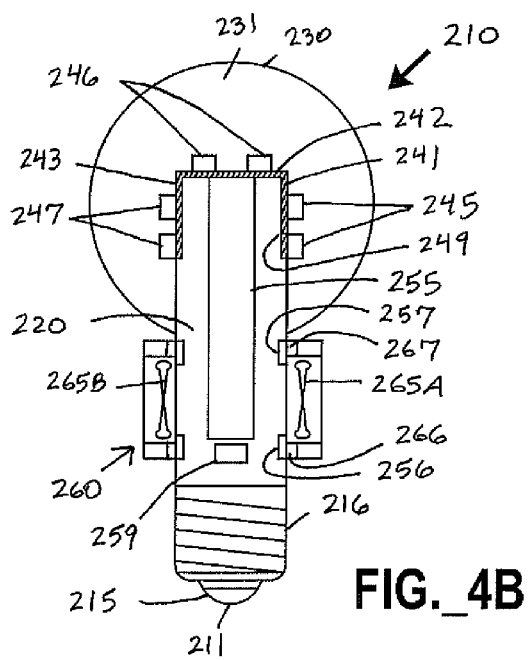
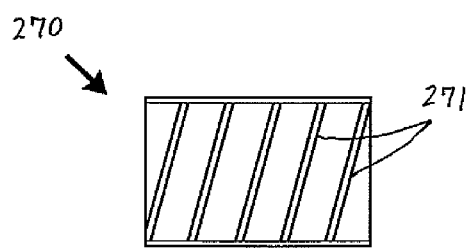
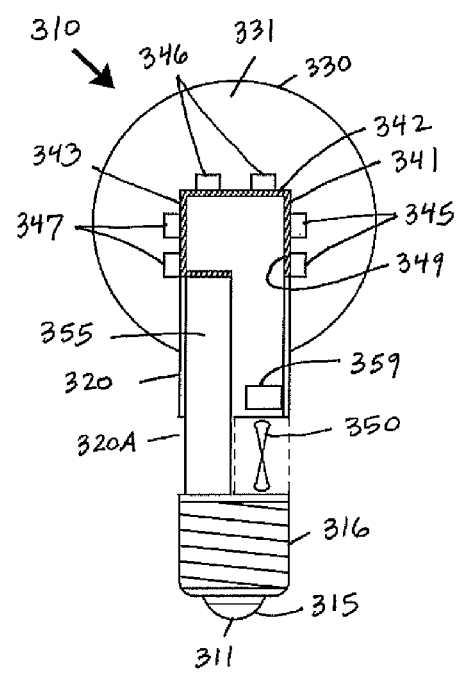
FIG._4A
FIG._4B
FIG._4C
FIG._5

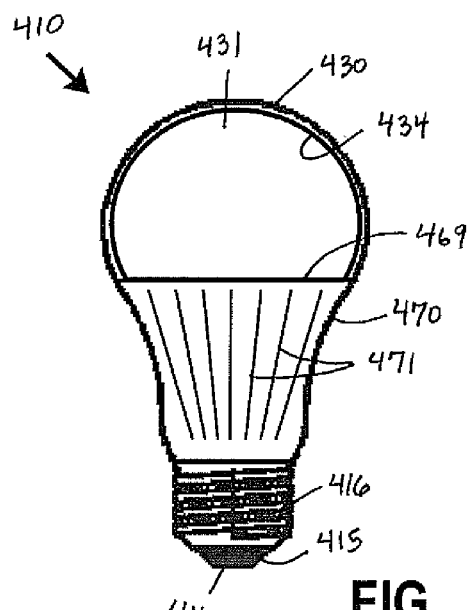
FIG._6
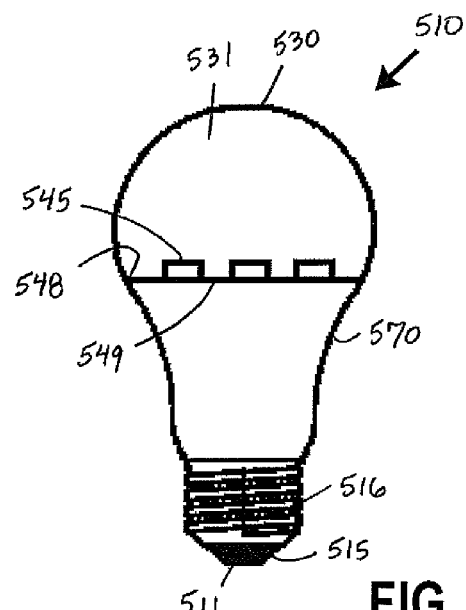
FIG._7
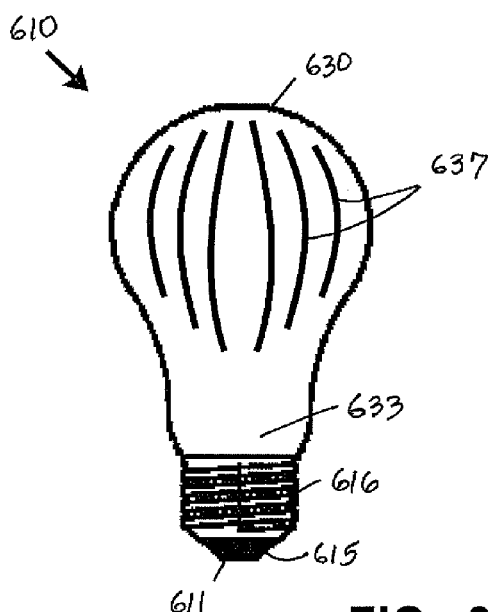
FIG._8
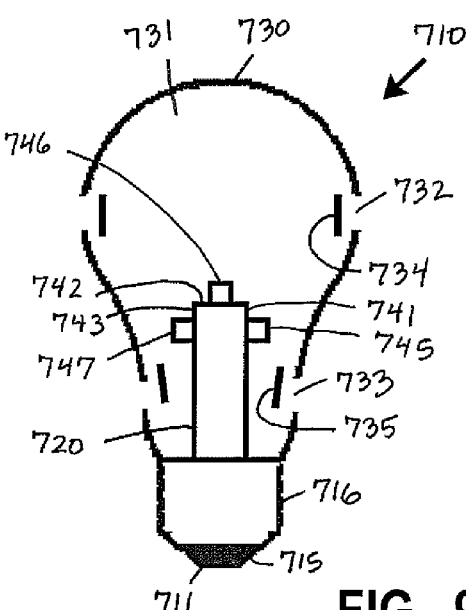
FIG._9

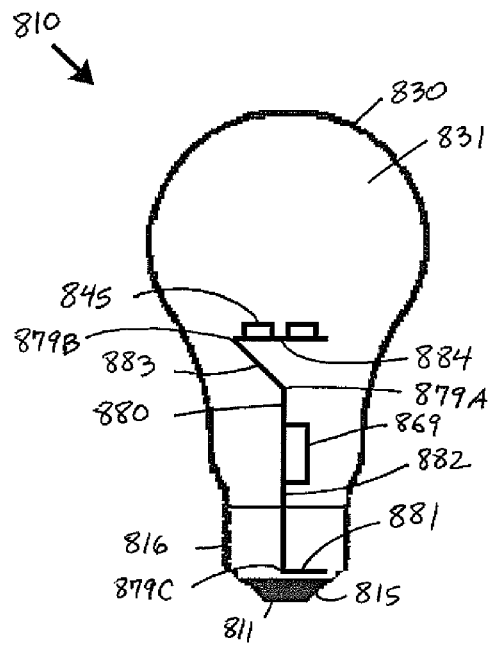
FIG._10A
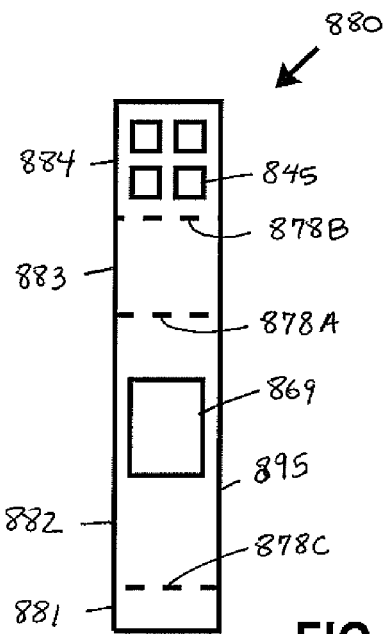
FIG._10B
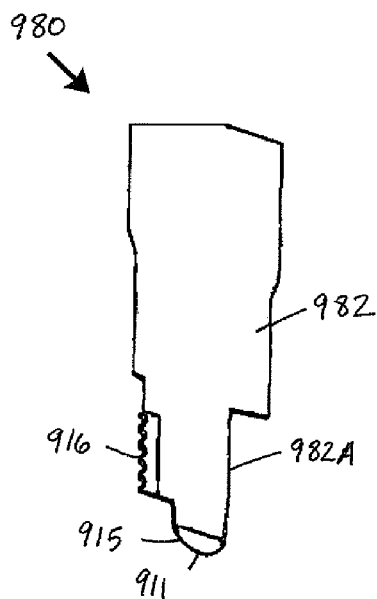
FIG._11A
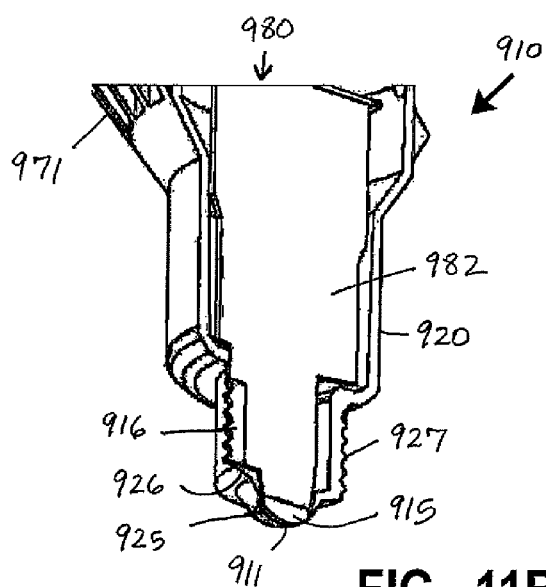
FIG._11B

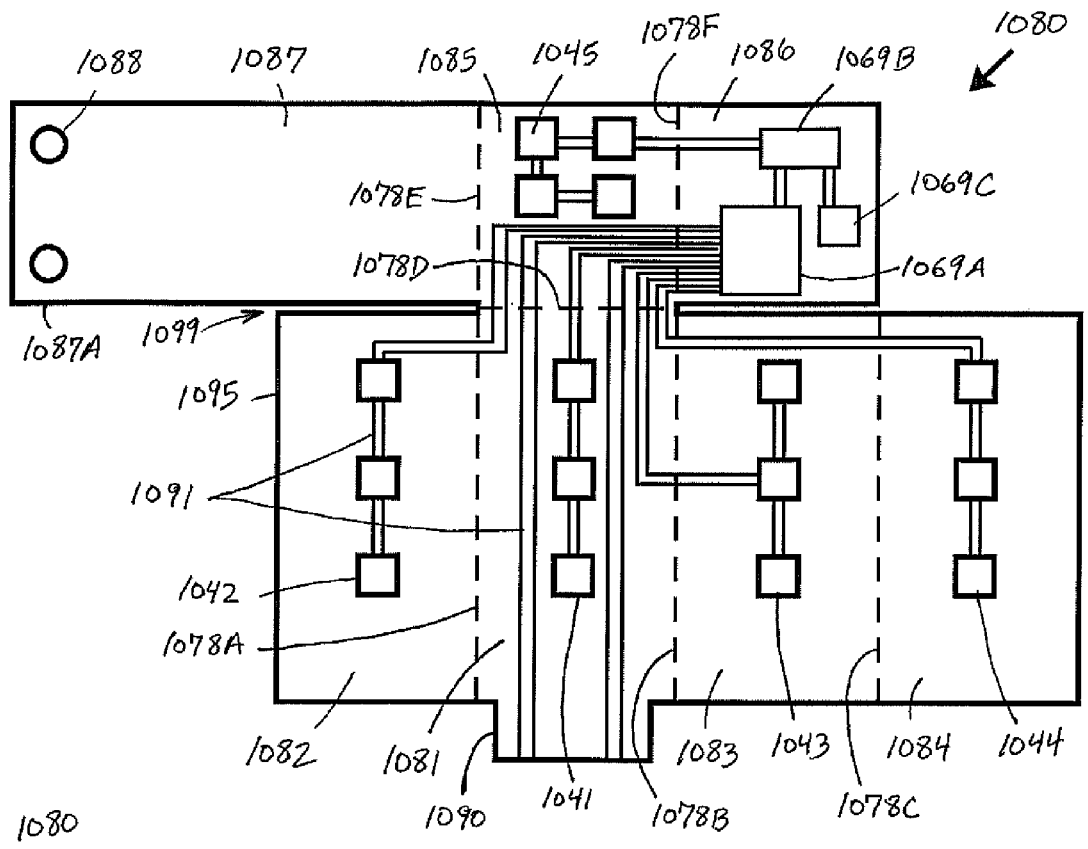
FIG._12A
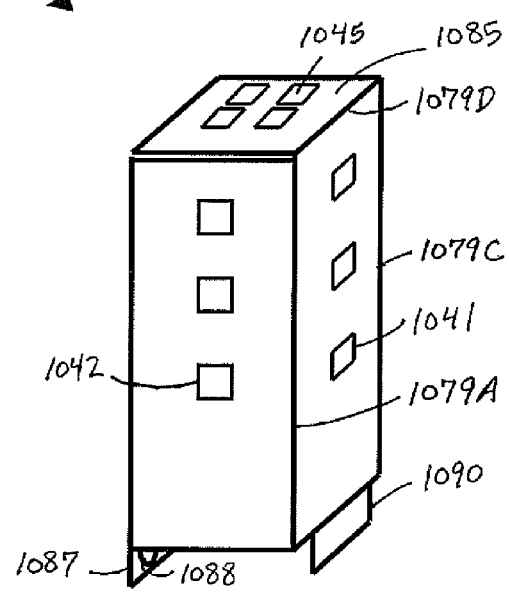
FIG._12B

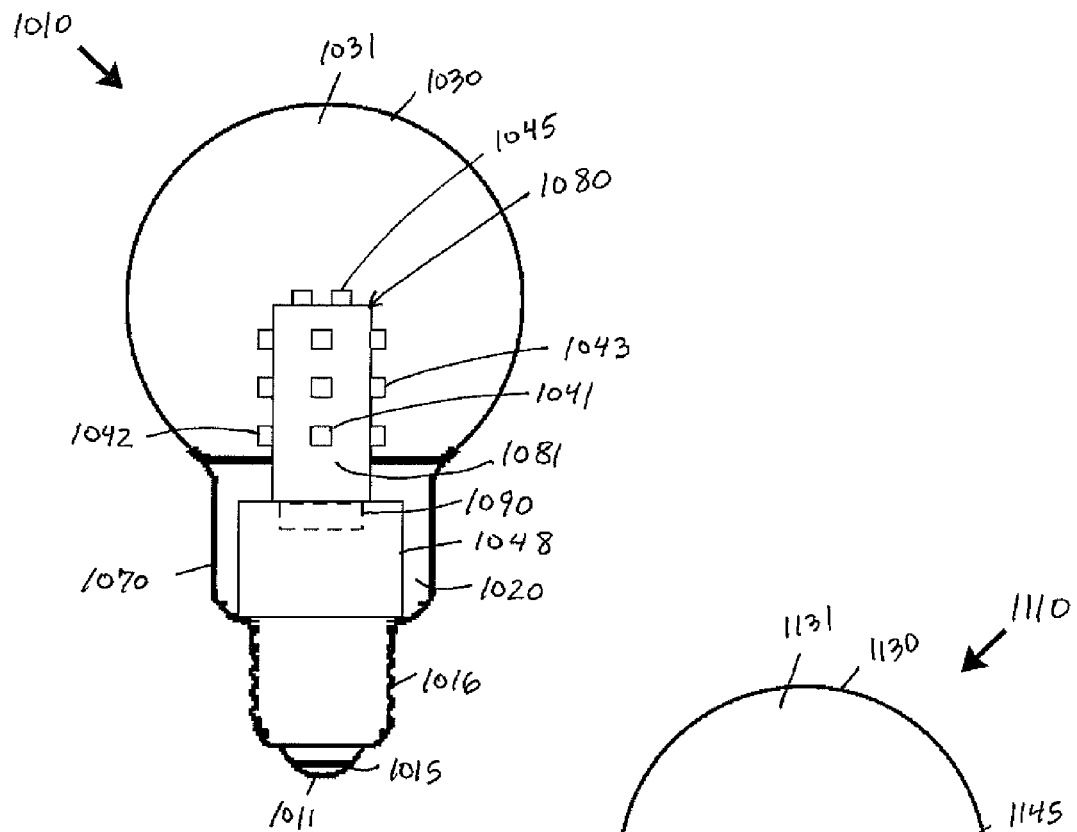
FIG._13
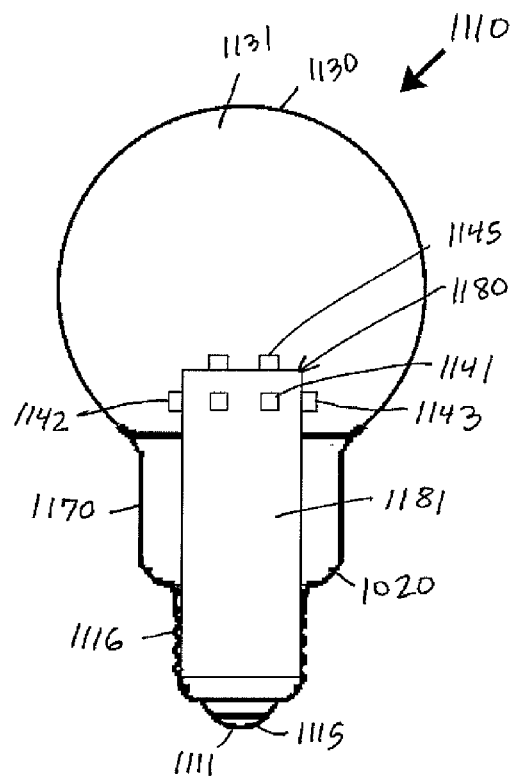
FIG._14

US 8,596,821 B2

LED LIGHT BULBS

FIELD OF THE INVENTION

The present invention relates to solid state lighting devices, including light bulbs with one or more light emitting diodes.

DESCRIPTION OF THE RELATED ART

Light emitting diodes (LEDs) are solid state devices that convert electric energy to light, and generally include one or more active layers of semiconductor material sandwiched between oppositely doped layers. When bias is applied across doped layers, holes and electrons are injected into one or more active layers where they recombine to generate light that is emitted from the device. Laser diodes are solid state emitters that operate according to similar principles.

Solid state light sources may be utilized to provide colored (e.g., non-white) or white LED light (e.g., perceived as being white or near-white). White solid state emitters have been investigated as potential replacements for white incandescent lamps. A representative example of a white LED lamp includes a package of a blue LED chip (e.g., made of InGaN and/or GaN), coated with a phosphor (typically YAG:Ce) that absorbs at least a portion of the blue light and re-emits yellow light, with the combined yellow and blue emissions providing light that is perceived as white or near-white in character. If the combined yellow and blue light is perceived as yellow or green, it can be referred to as 'blue shifted yellow' ("BSY") light or 'blue shifted green' ("BSG") light. Addition of red spectral output from a solid state emitter or lumiphoric material (e.g., phosphor) may be used to increase the warmth of the white light. As an alternative to phosphor-based white LEDs, combined emission of red, blue, and green solid state emitters and/or lumiphors may also be perceived as white or near-white in character. Another approach for producing white light is to stimulate phosphors or dyes of multiple colors with a violet or ultraviolet LED source. A solid state lighting device may include, for example, at least one organic or inorganic light emitting diode and/or laser.

Many modern lighting applications require high power solid state emitters to provide a desired level of brightness. Emissions from high power LEDs are often transmitted through a diffuser to create light of a more diffuse and pleasing character. High power LEDs can draw large currents, thereby generating significant amounts of heat that must be dissipated. Heat dissipating elements such as heatsinks are commonly provided in thermal communication with high intensity LEDs, since is necessary to prevent a LED from operating at an unduly high junction temperature in order to increase reliability and prolong service life of the LED. Aluminum is commonly employed as a heatsink material, owing to its reasonable cost, high thermal conductivity, corrosion resistance, and relative ease of fabrication. Aluminum heatsinks for solid state lighting devices are commonly formed in various shapes by casting, extrusion, and/or machining techniques.

It would be desirable to provide a LED light bulb capable of replacing an incandescent bulb without sacrificing light output characteristics, but various limitations have hindered widespread implementation of LED light bulbs. One limitation that has limited widespread implementation of LED light bulbs includes fabrication cost, since assembly of numerous portions of conventional LED light bulbs typically entails assembly by hand—such as to make mechanical, electrical, and thermal (heat transfer) connections. Another limitation associated with conventional LED light bulbs includes limited directional light output. That is, in the context of a conventional high-output LED light bulb, at least a portion of a heatsink is arranged between the base and globe (or cover) portions of the bulb, with the globe or cover typically serving to protect the LED(s) and diffuse light emitted therefrom. Unfortunately, a heatsink of sufficient size to dissipate the quantity of heat generated by the LED(s) tends to block output of light proximate to the base of the bulb. When such a bulb is placed pointing upward in a table lamp, the resulting low intensity of light output in an area below the bulb and shadows are not pleasing to many users.

It would be desirable to reduce or eliminate hand assembly steps, and therefore reduce cost, for fabricating LED light bulbs. It would also be desirable to enhance heat dissipation in LED light bulbs in order to reduce the need for bulky external heatsinks, and therefore provide light output over a greater range of directions, including enhanced output proximate to the base of a LED light bulb. It would also be desirable to promote lower LED junction temperatures in order to prolong LED operating life.

SUMMARY OF THE INVENTION

The present invention relates to improved LED light bulbs that address various limitations associated with known LED light bulbs.

In one aspect, the invention relates to light emitting diode (LED) light engine adapted for use in a LED light bulb, the LED light engine comprising at least one LED mounted to a substrate having patterned thereon at least one electrical trace, the substrate comprising at least one heat conduit portion with which the at least one LED is arranged in conductive thermal communication, wherein the substrate includes at least one bend therein to form a substantially rigid upright support structure for the at least one LED. An associated aspect relates to a LED light bulb comprising the foregoing light engine.

In another aspect, the invention relates to a method comprising: patterning a substantially planar substrate to define at least one electrical trace for at least one light emitting diode (LED); mounting at least one LED to the substrate; and shaping the substrate to define at least one bend therein to form at least one substantially rigid upright support structure for the at least one LED. Such methods may be utilized in the fabrication of one or more LED light engines, and associated LED light bulbs.

A further aspect of the invention relates to a light emitting diode (LED) light bulb comprising: a cover defining an interior volume, wherein at least a portion of the cover comprising a material having visible spectrum transmittance of least about 80% and a thermal conductivity of at least 25 W/(m·° K) at about 25° C.; and a substrate supporting at least one LED, wherein the at least one LED and at least a portion of the substrate are disposed within the interior volume.

In an further aspect, the invention relates to a light emitting diode (LED) light bulb comprising: a cover defining an interior volume, the cover comprising a material adapted to transmit at least a portion of light in the visible spectrum; at least one LED disposed within the interior volume; a support column comprising a plurality of electrical conductors in electrical communication with the at least one LED; and first and second electrical contacts disposed in or on the support column and arranged to mate with an electrical receptacle to receive electric current, wherein the first and second electrical contacts are in electrical communication with the plurality of electrical conductors; wherein a portion of the support column is disposed outside of the interior volume and is exposed to an ambient environment.

A further aspect of the invention relates to a light emitting diode (LED) light bulb comprising: a cover defining an interior volume, the cover comprising a material adapted to transmit at least a portion of light in the visible spectrum; a substrate supporting at least one LED, wherein the at least one LED and at least a portion of the substrate are disposed within the interior volume; and at least one opening defined in the cover, wherein the at least one opening is in fluid communication with an ambient environment.

In another aspect, any of the foregoing aspects and/or other features and embodiments disclosed herein may be combined for additional advantage.

Other aspects, features and embodiments of the invention will be more fully apparent from the ensuing disclosure and appended claims.

BRIEF DESCRIPTION OF THE DRAWINGS

FIG. 1 is a schematic side elevation view of a LED light bulb according to one embodiment of the present invention, including a support column that is vented to permit fluid communication between an ambient environment and an interior volume of the bulb defined by a cover, with the support column including an integral screw base portion.

FIG. 2 is a schematic side elevation view of a column portion of a LED light bulb according to another embodiment, with the support column being ventilated and including a screw base portion attached thereto.

FIG. 3 is a schematic side elevation view of a LED light bulb according to another embodiment, with the support column being ventilated, and with a cover enclosing an interior volume of the bulb also defining multiple ventilation ports.

FIG. 4A is a schematic cross-sectional assembly view of a LED light bulb according to another embodiment, including a heatpipe within a support column, and including a preferably removable fan portion arranged to engage the support column and promote forced convective cooling of the light bulb.

FIG. 4B is a schematic cross-sectional view of the LED light bulb of FIG. 4A in an assembled state.

FIG. 4C is a schematic side elevation view of a heatsink arranged for use with a LED light bulb similar to the bulb depicted in FIGS. 4A-4B, as an alternative to the fan portion.

FIG. 5 is a schematic cross-sectional view of a LED light bulb according to another embodiment, including a cooling fan and a heatpipe integrated with a support column of the bulb.

FIG. 6 is a schematic side elevation view of a LED light bulb according to another embodiment, including a composite cover arranged to promote cooling of the light bulb.

FIG. 7 is a schematic side elevation view of a LED light bulb according to another embodiment, including a cover portion that is optically transmissive and thermally conductive, and an internal heat spreader arranged to conduct heat to the cover portion.

FIG. 8 is a schematic side elevation view of a LED light bulb according to another embodiment, including a cover portion that is optically transmissive and thermally conductive, with the cover portion defining multiple fins.

FIG. 9 is a schematic side cross-sectional view of a LED light bulb according to another embodiment, including a cover defining an interior volume of the bulb, wherein the cover includes ports or openings to permit fluid communication between an ambient environment and the interior volume of the bulb, and baffles are arranged proximate to the ports or openings.

FIG. 10A is a schematic side cross-sectional view of a LED light bulb according to another embodiment, including a LED light engine portion formed from a planar substrate to provide mechanical support, electrical communication, and thermal conduction for multiple LEDs, wherein the substrate has been bent following various planar processing steps to form the light engine.

FIG. 10B is a schematic front elevation view of the LED light engine contained in the LED light bulb of FIG. 10A.

FIG. 11A is a schematic perspective view of a portion of a substrate including first and second edge connectors arranged for mating with electrical contacts of a socket or fixture to supply electric current to a LED light bulb as disclosed herein, according to another embodiment of the present invention.

FIG. 11B is a schematic perspective cross-sectional view of the substrate portion of FIG. 11A arranged within a housing of a LED light bulb and including apertures through which the first and second edge connectors may extend for engagement with electrical contacts of a socket or fixture to supply electric current to a LED light bulb as disclosed herein.

FIG. 12A is a schematic front elevation view of a LED light engine according to another embodiment, with the LED light engine including a planar substrate to provide mechanical support, electrical communication, and thermal conduction for multiple LEDs, and the LED light engine being adapted for bending into a box-like shape with LEDs arranged on several sides.

FIG. 12B is a simplified schematic perspective view of the LED light engine of FIG. 12A, following bending of the substrate to form a box-like shape.

FIG. 13 is a schematic side cross-sectional view of a LED light bulb according to another embodiment, including a LED light engine similar to that depicted in FIGS. 12A-12B, occupying a fraction of the length of a base portion of the light bulb.

FIG. 14 is a schematic side cross-sectional view of a LED light bulb according to another embodiment, including a LED light engine occupying substantially the entire length of a base portion of the light bulb.

DETAILED DESCRIPTION OF THE INVENTION, AND PREFERRED EMBODIMENTS THEREOF

The present invention now will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey the scope of the invention to those skilled in the art. In the drawings, the size and relative sizes of layers and regions may be exaggerated for clarity.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Unless the absence of one or more elements is specifically recited, the terms "comprising," "including," and "having" as used herein should be interpreted as open-ended terms that do not preclude presence of one or more elements.

As used herein, the terms "solid state light emitter" or "solid state light emitting device" may include a light emitting diode, laser diode and/or other semiconductor device which includes one or more semiconductor layers. A solid state light emitter generates a steady state thermal load upon application of an operating current and voltage to the solid state emitter. Such steady state thermal load and operating current and voltage are understood to correspond to operation of the solid state emitter at a level that maximizes emissive output at an appropriately long operating life (preferably at least about 5000 hours, more preferably at least about 10,000 hours, more preferably still at least about 20,000 hours).

Solid state light emitters may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called 'lumiphoric') materials in LED devices may be accomplished by adding such materials to encapsulants, adding such materials to lenses, or by direct coating onto LEDs. Other materials, such as dispersers and/or index matching materials, may be included in such encapsulants.

The present invention relates in various aspects to LED light bulbs providing at least one of improved thermal characteristics, reduced complexity and cost of fabrication, and improved performance.

In one embodiment, a LED light bulb includes a support column with a portion arranged inside an at least partially transmissive cover (also termed a "globe"), and a portion extending through the cover and exposed an ambient environment. Such support column may provide structural, electrical, and/or heat transfer functions. In one embodiment, such a support column may be devoid of a separate (e.g., molded) body disposed around the support column.

Covers for LED light bulbs according to certain embodiments may be formed of suitably transmissive materials such as (but not limited to) polymeric materials and/or glass. Transmissive materials in this context referred to materials adapted to transmit at least a portion of light in the visible spectrum. A LED light bulb cover may comprise a diffuser arranged to diffuse light emitted by one or more solid state emitters. Such a cover may include one or more lenses to provide focusing, directional pointing, or light shaping utility. A cover may alternatively, or additionally, include one or more lumiphors (e.g., phosphors) arranged to interact with light emitted by one or more LEDs (i.e., to receive light emitted by a LED of one peak wavelength and responsively emit light having at least one other peak wavelength that differs from the peak wavelength of the LED emissions). Various utilities such as by diffusion, light focusing and/or pointing, and light conversion may be provided by layers or structures that are contacting or are spatially segregated from (e.g., disposed within) a cover.

A LED light bulb cover may be symmetric or intentionally asymmetric in character. A cover associated with a solid state lighting device including a heatsink is described herein may be provided in any suitable size or shape, including planar, spherical, hemispherical, and the like. At least a portion of such a cover may resemble a globe in shape.

The term "support column" as used herein is intended in a functional sense to refer to an element extending in a direction between a base end and a LED emitter of a LED light bulb, and providing direct or indirect support for one or more emitters. Direct support in this context contemplates mounting of a LED to a surface formed on or over a support column, whereas indirect support contemplates presence of one or more structural elements arranged between a support column and a LED. A support column is not strictly limited to any particular shape or conformation. In one embodiment, a support column is arranged as a tubular element of any desired cross-sectional shape, optionally including at least one hollow portion. In another embodiment, a support column may be devoid of a hollow interior, and may include flat portions or substantially planar portions.

A support column extending through a cover of a LED light bulb may provide structural support for one or more solid state emitters, may have associated electrical conductors to permit electrical communication with one or more solid state emitters, and/or provide heat transfer and/or heat dissipation utility. Such a support column may include one or more channels, recesses, or cavities (whether open or closed) arranged to contain operative components (e.g., conductors, control and/or circuit elements, heat transfer elements, sensors, etc.) and/or permit flow of cooling fluid such as air. Channels, recesses, or cavities formed in a support column of a LED light bulb may be arranged in any suitable conformation (whether in fluid communication with one another or not), such as concentric, side-by-side, intersecting, and non-intersecting.

In one embodiment, first and second electrical contacts of a LED light bulb are disposed in or on a support column and are arranged to mate with an electrical receptacle to receive electric current, with the electrical contacts being electrical communication with at least one LED by way of electrical conductors arranged in or on the support column. In one embodiment, at least one LED drive circuit element and/or LED control circuit element is arranged in or on a support column of a LED light bulb. Such circuits may include, but are not limited to driver circuits, ballast circuits, dimmer circuits, voltage control circuits, current control circuits, color control circuits, electrostatic discharge elements, sensors and/or sensory feedback circuits, temperature protection circuits, and the like. In one embodiment, the support column comprises an electrically conductive material (e.g., a metal), with an electrically insulating material arranged in or on at least one portion thereof. Such insulating material may be formed as a coating or covering arranged over at least a portion of the support column. In one embodiment, a support column comprises an electrically insulating material with at least one electrically conductive material arranged therein or thereon. In preferred embodiments, an externally accessible surface of the support column comprises an electrically insulating material to prevent electric shock by a user contacting such a column. In one embodiment, a support column defines a lateral contract and a foot contact of an Edison-type threaded light bulb connector. In another embodiment, one or more contacts of an Edison-type threaded light bulb connector are prefabricated (e.g., in the form of a cap) and fitted to a support column by mechanical engagement. Although various embodiments disclosed herein include Edison-type threaded connectors, it is to be appreciated that LED light bulbs may be formed with electrical connectors of any suitable type known or developed in the art.

In one embodiment, a support column comprises one or more LED mounting surfaces arranged to receive LEDs. When multiple LED mounting surfaces are provided, such services may be non-coplanar to one another, to permit light from different LEDs to be emitted in different directions. In various embodiments, LED mounting surfaces may be flat, raised, or recessed. And LED mounting surface may have associated therewith at least one heat spreader and/or heatsink arranged to spread and/or dissipate heat generated by at least one LED. Heat spreaders and/or heatsinks associated with a LED mounting surface may or may not be electrically active. Thermal contact may be enhanced by use of thermally conductive paste or other suitable heat transfer enhancement media. Electrical connections between a mounting surface and a LED may be made by soldered surface connections and/or wirebonds. In one embodiment, one or more LED mounting surfaces are integrally formed in or on a support column of a LED light bulb. In another embodiment, one or more LED mounting surfaces are formed on a prefabricated element arranged for coupling to at least one portion of a support column.

In certain embodiments, a support column includes at least one opening or port in fluid communication with the interior volume defined by the cover to permit fluid communication with an ambient environment. Movement of air or other fluid through one or more openings or ports may occur through natural convection, may be motivated by one or more fluid circulation elements (e.g., fans, blowers, fluid pumps, charged elements to promote ionic air movement, or the like) arranged in or on a LED light bulb, or may be driven by pressure supplied by an external fluid source.

In certain embodiments, various types of heat transfer elements may be associated with a support column of a LED light bulb. A support column may include or have associated there with at least one of the following: a heatpipe, an internal fan or blower, and external fan or blower, a thermoelectric cooler, a thermally conductive heat spreader, and thermally conductive heatsink (e.g., including a plurality of fins). Multiple heat transfer elements of different types may be combined in a single LED light bulb. In one embodiment, a LED light bulb may include one or more portions of arranged for nondestructive removal in order to permit changing or servicing of a heat transfer element or other component.

In certain embodiments, a cover portion of a LED light bulb defines an interior volume containing at least one LED disposed therein, and the cover portion defines at least one opening or port in fluid communication with an ambient environment. At least one additional port may be defined in the cover and/or a base (e.g., column) portion of the LED light bulb to enable circulation of air or other fluid through the multiple openings or ports, to enable convective cooling of at least certain portions of the LED light bulb. A first opening or port may be defined in a cover, and a second opening or port may be defined in a support column, with a channel defined in the support column extending between the first and the second opening or port to provide fluid communication therebetween through the support column. In one embodiment, a cover may comprise multiple portions, with a port or opening defined between such portions.

In one embodiment including a LED light bulb cover defining at least one opening, at least one baffle is provided and arranged to prevent unobstructed visibility of at least one LED. Such baffle is preferably at least partially transmissive of at least one wavelength in the visible range, and may be formed of substantially the same material as that of the cover, or formed of a different material from that of the cover. Multiple openings and multiple baffles may be provided. A baffle may be provided within the interior volume defined by the cover, or may be provided outside the cover. A baffle may be integrally formed with the cover, or may be separately formed and affixed to the cover following fabrication thereof. One or more spacing elements may be provided between a baffle and the cover to ensure that the baffle is disposed apart from the cover. In one embodiment, a baffle comprises a secondary covering element (including multiple holes therein) arranged over at least one LED, with the cover comprising a primary covering element arranged over such baffle.

In one embodiment, an opening defined in the cover of a LED light bulb has associated therewith a filter element arranged to inhibit passage of dust or other particulate matter into the interior volume defined by the cover. Such filter element (which may be disposed along an external surface of the cover and/and mechanically retained with one or more clips, snap fittings, magnets, wires, or other retaining elements arranged to cooperate with the cover or another portion of the light bulb) may removable in character to permit the filter element to be periodically cleaned or changed. In one embodiment, one or more sensors (e.g., optical sensor, thermal sensor, pressure sensor, differential pressure sensor, operating time sensor, and/or airflow sensor, etc.) may be arranged to sense a condition indicative of a need for a filter to be cleaned or changed, and the LED light bulb may cause a user to be alerted to such condition. Such alert may be in the form of an audible or visible alarm, any change in operating condition of the LED light bulb, or other user perceptible interaction. In one embodiment, a filter element includes an authentication element arranged for communication with at least a portion of a LED light bulb. Such authentication element may include a radio frequency identification tag, a microchip, an EEPROM, or other information containing medium suitable for outputting a signal to be received a corresponding interrogation or reading element of a LED light bulb. An authentication element may optionally engage in a challenge-and-response authentication scheme. Through use of an authentication element, a manufacturer of a LED light bulb may ensure that only a filter approved by the manufacturer may be used in conjunction with the LED light bulb, such as to minimize warranty exposure.

In one embodiment, a LED light bulb included a cover adapted to provide both light transmission and heat dissipation utility. Typical LED light bulbs include conventional glass or polymeric covers (e.g., diffusers and/or lenses), with such covers generally constituting thermal insulators. Heating of conventional polymeric covers may be avoided to prevent discoloration and/or deformation of such material. To provide enhanced heat dissipation utility, in certain embodiments according to the present invention, at least a portion of a cover for a LED light bulb may comprising a material having reasonably high visible spectrum transmittance (e.g., at least about 80%, more preferably at least about 85%, more preferably at least about 90%, more preferably at least about 95%, more preferably at least about 97% of at least one wavelength in the visible range) together with high thermal conductivity (i.e., at a temperature of about 25° C. or 298° K, since thermal conductivity is temperature dependent). Such high thermal conductivity may be at least about 25 W/(m·° K), more preferably at least about 50 W/(m·° K), more preferably at least about 75 W/(m·° K), more preferably at least about 100 W/(m·° K), more preferably at least about 150 W/(m·° K), and more preferably at least about 200 W/(m·° K), including ranges of the foregoing minimum values optionally bounded by an upper threshold thermal conductivity of up to about 210 W/(m·° K). Examples of materials exhibiting both (a) visible spectrum transmittance within one or more of the foregoing ranges, and (b) high thermal conductivity within one or more of the foregoing ranges, include, but are not limited to, sintered silicon carbide, crystalline silicon carbide, and high thermal conductivity glass (e.g., comprising indium tin oxide).

In one embodiment, a thermally conductive cover for a LED light bulb comprises a plurality of fins. Such fins may be formed, for example, by sintering (heating of powdered precursor material, often with an additional binder material) and/or by machining. In one embodiment, a thermally conductive cover for a LED light bulb serves as an optical diffuser or at least one lens. In one embodiment, a thermally conductive cover for a LED light bulb includes or has associated therewith a lumiphoric material arranged to downconvert emissions from the at least one LED.

In one embodiment, a heat spreader and/or heatsink associated with a LED light bulb is arranged in conductive thermal communication with at least one LED and with a thermally conductive cover as described herein. In one embodiment, a thermally conductive cover for a LED light bulb comprises at least one opening, optionally including at least one baffle, as described herein.

In one embodiment, substantially all of a thermally conductive cover comprises a material having visible spectrum transmittance of least about 80% and a thermal conductivity of at least 25 W/(m·° K). In another embodiment, a cover comprises different materials. In one example, a cover includes a first cover portion comprising a material having visible spectrum transmittance of least about 80% and a thermal conductivity of at least 25 W/(m·° K), and a second portion having a visible spectrum transmittance of less than about 80% and a thermal conductivity of greater than 25 W/(m·° K). The first and second portions may be coupled along an interface arranged to promote conductive heat transfer therebetween.

In certain embodiments, fabrication of LED light bulbs may be simplified through use of LED light engines fabricated utilizing techniques suitable for planar substrates (e.g., circuit boards), and then shaping such a substrate with at least one bend therein to form a substantially rigid upright support structure for at least one LED. A LED light engine may be formed from a planar substrate to provide mechanical support, electrical communication, and thermal conduction for one or multiple LEDs. In one embodiment, a substrate is shaped to form multiple non-coplanar LED support surfaces adapted to support a plurality of LEDs. Shaping of the substrate may be performed before or after the mounting of at least one LED to the substrate. In one embodiment, a substantially rigid "upright" support structure defines a gap arranged below a substrate mounting layer or portion, preferably internal to the light engine. Such gap is consistent in character with the upright nature of the light engine according to one embodiment, as distinguished from a conventional LED package including a molded polymeric body surrounding at least a portion of a leadframe, wherein contact portions of the leadframe may be bent downward for mounting to a target surface. In one embodiment, a LED light engine as disclosed herein is devoid of a polymeric body structure encasing at least a portion of a conductive metal portion of a substrate, as further distinguished from a conventional LED package.

In one embodiment, a substantially planar substrate may be patterned to define at least one electrical trace (and preferably multiple electrical traces) for LEDs and associated one circuit element(s). LEDs and various circuit elements (e.g., LED drive control elements and/or LED control circuit elements) may be mounted to, defined in, or defined on a substrate. LEDs and/or circuit elements may be arranged on one and/or both sides of a single substrate The substrate may be shaped to define at least one bend therein to form the substantially rigid upright support structure. Such a support structure is preferably self-supporting, without requiring use of additional rigid support to retain a desired position.

One advantage of using techniques suitable for planar substrates is that multiple substrates may be fabricated simultaneously, and then cut into multiple segments or formation of multiple LED light engines. For example, electrical traces for a multitude of LEDs and electrical circuit elements may be patterned on at least one surface of a substrate. Multiple LEDs may be mounted in and/or on the substrate. The substrate may then be cut into multiple segments, with each segment being subject to one or more shaping steps to define at least one bend therein for formation of LED light engine embodying substantially rigid support structures. LED light engines may be formed into any of various shapes, including open and closed forms.

In one embodiment, a substrate comprises a metal core print circuit board (PCB). In one embodiment, a substrate include a stamped metal layer and at least one electrically insulating layer. In one embodiment, a substrate comprises at least one heat conduit portion, and at least one LED may be arranged for mounting in conductive thermal communication with the heatsink portion. In one embodiment, a substrate comprises portions of different thicknesses. For example, metal of a first gauge may be utilized for formation of heat electrical traces, and metal of a second (e.g., thicker) gauge may be utilized for formation of heat conduit portions (e.g., as may be appropriate for supporting LEDs and/or circuit elements associated with LEDs. In one embodiment, a substrate comprises portions fabricated from of different metals, such as a copper portion for use in forming electrical traces, and an aluminum portion for use in forming a heat conduit or heatsink In one embodiment, a heat conduit portion of the substrate is arranged to extend or protrude through a base portion or housing of a LED light bulb. In one embodiment, a heat conduit portion comprises a heatsink with a plurality of fins. In one embodiment, a heat conduit portion of a LED light engine may be arranged in conductive thermal communication with a secondary heatsink having at least one surface arranged external to the LED light bulb. A heat conduit portion of a LED light engine may be electrically active, or may be electrically isolated from the at least one LED or other circuit elements and/associated therewith.

A base end of a LED light engine may include electrical contacts arranged to mate with or engage an electrical receptacle (e.g., a socket or fixture) to receive electric current, for supply of same to at least one LED affixed to the light engine. In one embodiment, a substrate comprises at least one edge connector adapted to engage at least one electrical contact of a receptacle (e.g., socket or fixture) to supply electrical current to the LED light engine. Various details relating to edge connectors are disclosed in U.S. patent application Ser. No. 12/730,802 filed on Mar. 24, 2010 and entitled INTERFACE AND FABRICATION METHOD FOR LIGHTING AND OTHER ELECTRICAL DEVICES, with such application hereby being incorporated by reference herein in its respective entirety, for all purposes. One or more edge connectors may extend through one or more apertures (e.g., slots) defined in a support column or housing of a LED light bulb. Such support column or housing may be electrically insulating.

In one embodiment, a LED light engine may occupy only a fraction of the length of the base portion of a LED light bulb. Such a LED light engine may be arranged for mounting with one or more underlying support and/or mounting elements. In another embodiment, a LED light engine may occupy substantially the entire length of the base portion of a LED light bulb. A LED light engine may be inserted into a base or housing or protection thereof. Such base or housing may include an external heatsink arranged in conductive thermal communication with at least one heatsink portion of the LED light engine.

Various advantages and features according to the present invention are illustrated with reference to the drawings.

FIG. 1 illustrates a LED light bulb 10 according to one embodiment of the present invention. The light bulb 10 includes a base end 11, multiple LEDs 45-47 arranged within an interior volume 30 defined by a cover 30, and a support column 20 extending between the base end 11 and the cover 30. Provided along the base end 11 are a foot contact 15 and a lateral contact 16 arranged for mating with a threaded Edison-type socket. The LEDs 45-47 are arranged on multiple LED mounting surfaces 41-43, respectively. Such LED mounting surfaces 41-43 may be formed concurrently with the support column 20, or may be arranged on a prefabricated section 40 arranged for coupling to the support column 20. The support column 20 may be fabricated with an internal portion of electrically conductive material having a layer or coating of electrically insulating material 29 arranged over exposed portions thereof, so as to prevent electric shock by user contacting the support column 20. In such an embodiment, one or both of the lateral contact 16 and the foot contact 15 (which may be segregated by an annular insulating element (not shown)) may be integrally formed with the support column 20. The support column 20 has defined therein multiple first ports or openings 26 arranged along an external surface, and multiple second ports or openings 28 disposed within the cover 30. One or more passages or channel (not shown) may be arranged within or along an external surface of support column 20, to permit movement of air between the multiple ports or openings 26, 28 such that the interior volume 31 is in fluid communication with an ambient environment. Such arrangement permits escape of heat from the interior volume 31, thereby reducing the need for heat sinks in order to cool the LED light bulb 10.

FIG. 2 illustrates at least a portion of a LED light bulb similar to the bulb 10 shown in FIG. 1, with the portion being devoid of a cover, and including an electrically insulating support column 20A extending (a) between a prefabricated base contact portion including a base end 11A, a foot contact 15A, and a lateral contact 16A, and (b) a prefabricated section 40A including LED mounting surfaces to which LEDs 45A-47A, respectively, are mounted. Each of the base contact portion and the prefabricated section 40A may be affixed to the support column 20A by any suitable joining method, including mechanical coupling, adhesives, and/or similar methods.

FIG. 3 illustrates another LED light bulb 110 similar to the embodiment shown in FIG. 1, with the addition of a fluid circulation element 50 to the support column 120, and the addition of multiple ports or openings 132, 133 in the cover 130 and associated baffles 133, 134. The light bulb 110 includes a base end 111, multiple LEDs 145-147 arranged within an interior volume 131 defined by a cover 130, and a support column 120 extending between the base end 111 and the cover 130. Electrical contacts 115, 116 are arranged proximate to the base end 111. The support column 120 includes an electrically insulating material layer 129 disposed along and outside surface thereof. The support column 120 has defined therein multiple first ports or openings 126 arranged along an external surface, and multiple second ports or openings 128 disposed within the cover 130. Air movement between such ports or openings 126-128 may be aided by a fluid circulation element 150, which may be embodied in a fan or blower. The ports or openings 132, 133 defined in the cover 130 have baffles 134, 135 arranged proximate thereto, preferably positioned to prevent unobstructed visibility of the LEDs 141-143. Each of the cover 130 and the baffles 134, 135 is preferably at least partially transmissive of at least one wavelength in the visible range, with the baffles 134, 135 and the cover 130 optionally be formed of substantially the same material.

Natural convection is a phenomenon that causes heat to rise; however the LED light bulb 110 may be positioned either upward or downward, so it is possible that forced convective flow (e.g., as motivated by the fluid circulating element 150) within the LED light bulb 110 may operating in a direction counter to natural convective flow. In order to avoid such counter-active effect, in one embodiment a LED light bulb may include a sensor arranged to sense mounting direction sensor, wherein circulation direction of the fluid circulating element 150 is controlled responsive to an output of such a sensor.

FIGS. 4A-4B illustrate a LED light bulb to 10 according to another embodiment, including a heat pipe to 55 within a support column 220, including a preferably removable exteriorly arranged fluid circulating (e.g., fan) portion 260 arranged to engage the support column 220 and promote forced convective cooling of at least a portion of the LED light bulb 210. The fluid circulating portion 260 defines an aperture 261 arranged to permit the fluid circulating portion 260 to fit over the exterior of at least a portion of the support column 220.

The light bulb 210 includes a base end 211, multiple LEDs 245-247 arranged within an interior volume 231 defined by a cover 230, and a support column 220 extending between the base end 211 and the cover 230. The LEDs 245-247 are arranged over support surfaces 241-243 in conductive thermal communication with an internal heat spreader 249 arranged in contact with a heatpipe 255 arranged to transport heat in or along the support column 220 in a direction from the heat spreader 249 toward the base end 211. Electrical contacts 215, 216 are arranged for mating with an external electrical receptacle are arranged near the base end 211. Additional electrical contacts 256, 257 are provided along the support column 220 for mating with corresponding contacts 266, 267 of the fluid circulating portion 260 in order to provide electric power to fluid circulating elements 265A-265B.

At least one sensor 259 may be arranged to sense one or more conditions (e.g., temperature, airflow, pressure differential, electric flow, etc.) indicative of needs to initiate or adjust operation of the fluid circulating elements 265A-265B, to limit operation of the LEDs 245-247, to clean or change the fluid circulating elements 265A-265B (or the entire fluid circulating portion 260), and so on. In one embodiment, a fluid circulating portion 260 includes an authentication element arranged for communication with at least a portion of a LED light bulb. Such authentication element may include a radio frequency identification tag, a microchip, an EEPROM, or other information containing medium suitable for outputting a signal to be received a corresponding interrogation or reading element of a LED light bulb. In this manner, a manufacturer of a LED light bulb may ensure that only a fluid circulating element approved by the manufacturer may be used in conjunction with the LED light bulb, such as to minimize warranty exposure.

As an alternative to the fluid circulating element 260, a heatsink 270 including multiple fins 271 may be fitted over an exterior portion of the support column 220 to promote passive cooling of the LED light bulb 210.

Referring to FIG. 5, a LED light bulb according to another embodiment includes a fluid circulating elements 350 and a heat pipe 355 integrated within a support column 320 of the light bulb 310. The light bulb 310 includes a base end 311, multiple LEDs 345-347 arranged within an interior volume 331 defined by a cover 330, and a support column 320 extending between the base end 311 and the cover 330. Electrical contacts 315, 316 are arranged proximate to the base end 311. The LEDs 345-347 are arranged on support surfaces 341-343 in conductive thermal communication with an internal heat spreader 349 arranged in contact with a heatpipe 355 arranged to transport heat in or along the support column 320 in a direction from the heat spreader 349 toward the base end 311. An opening 320A may be defined in the support column 320 to permit movement of air across one end of the heat pipe 355. At least one sensor 359 may be arranged to sense one or more conditions (e.g., temperature, airflow, pressure differential, electric flow, etc.) indicative of needs to initiate or adjust operation of the fluid circulating element 350, to limit operation of the LEDs 345-347, to clean or replace the fluid circulating element 350, and so on.

FIG. 6 illustrates a LED light bulb 410 according to another embodiment including a composite or multi-part exterior enclosing an interior volume 431. Arranged near a base end 411 are electrical contacts 415-416. Disposed between an upper cover portion 430 and the base end is a lower portion 470 that includes multiple cooling fins 471. In one embodiment, the lower portion 470 comprises a material having high transmittance and high thermal conductivity (e.g., visible spectrum transmittance of least about 80% and a room temperature thermal conductivity of at least 25 W/(m·° K) at about 25° C.) with multiple fins 471 formed therein, and the upper cover portion 430 is devoid of fins. The upper cover portion 430 may be formed of the same material as, or a different material from, the lower portion 470. The upper cover portion 430 and lower portion 470 may have different thicknesses, surface finishes or patterns, and/or comprise different materials to impart different optical properties to beams emitted in different directions (e.g., above or below a boundary 469) from the bulb 410. In one embodiment, the lower portion 470 comprises a substantially non-transmissive material (e.g., metal) and the upper portion comprises a material having high transmittance and high thermal conductivity as described above, and the boundary 469 is arranged to promote thermal conduction therebetween (e.g., with thermally conductive paste or other conductivity enhancing substances).

One or more light-affecting materials or structures 434 may be associated with (e.g., formed in or on) the upper cover portion 430, or disposed between the upper cover portion and emitters arranged with the device (which may be arranged proximate to the boundary 469). Such light-affecting material(s) or structure(s) 434 may include, but are not limited to, one or more diffusing elements, wavelength converting elements, light focusing elements, or light shaping elements.

FIG. 7 illustrates a LED light bulb 510 according to another embodiment, including a substrate with a heat spreader 549 for multiple LEDs 545 in conductive thermal communication (at contact surface 548) with one or both of a lower portion 570 and an upper cover portion 530 for dissipation of heat to an ambient environment. Mounting of LEDs to a substrate supported by an outer wall (e.g., upper cover portion 570 and/or lower portion 530) may eliminate need for an interior support column. Arranged near a base end 511 are electrical contacts 515-516. Conductors (not shown) may extend from the contacts 515-516 to a substrate supporting the LEDs 545 by any appropriate means, including use of individual wires, a flexible ribbon connector, a circuit board portion, or the like. In one embodiment, the upper cover portion 530 and the lower cover portion 570 constitute one continuous element. In another embodiment, the upper cover portion 530 comprises a material having high transmittance and high thermal conductivity, and the lower portion has differing thermal and/or optical transmissivity characteristics. The upper cover portion 530 and lower portion 570 may have different thicknesses, surface finishes or patterns, and/or comprise different materials to impart different optical properties to beams emitted in different directions (e.g., above or below a boundary along the heat spreader 549. In one embodiment, the lower portion 470 comprises a substantially non-transmissive material (e.g., metal) and the upper portion comprises a material having high transmittance and high thermal conductivity as described above.

FIG. 8 illustrates a LED light bulb 610 according to another embodiment, including a cover 630 comprising a material having high transmittance and high thermal conductivity, and defining multiple fins 637. Such fins 637 may or may not extend to a lower portion 633 arranged proximate to contacts 616, 615 disposed near a base end 611. The fins 637 may be formed, for example, by sintering (heating of powdered precursor material) and/or by machining. In one embodiment, the fins 637 are aligned in a generally longitudinal direction, generally perpendicular threads of the lateral contact 616. In another embodiment, fins 637 may be aligned in a generally transverse direction, in a diagonal direction, or in several directions. The number, direction, height, width, spacing, and surface finish of the fins may be selected to optimize one or both of thermal and optical characteristics.

FIG. 9 illustrates a LED light bulbs 710 according to another embodiment, including a cover 730 that includes multiple ports or openings 732, 733, and baffles 734, 735 disposed proximate to the ports or openings 732, 733. The LED light bulb 710 includes electrical contact 715, 716 disposed near a base end 711. A support element 720 is arranged within an interior volume 731 defined by the cover 730, with the LEDs 745-747 arranged on multiple surfaces 741-743 thereof. Such baffles 734, 735 are preferably arranged to prevent unobstructed visibility of LEDs 745-747. Such baffles 734, 735 may be integrally formed with the cover 730, or may be separately formed and affixed to the cover 730 following fabrication thereof. One or more spacing elements (not shown) may be provided between a baffle baffles 734, 735 and the cover 730 to ensure that spacing is maintained therebetween.

FIG. 10A illustrates a LED light bulb 810 and a LED light engine 880 suitable for use in fabricating the LED light bulb 810, and FIG. 10B illustrates the LED light engine 880 during fabrication thereof. Referring to FIG. 10B, a substrate 895 for use in fabricating the LED light engine 880 may include at least one electrically conductive layer and at least one electrically insulating layer, such as may be embodied in a metal core printed circuit board, or a layer of metal of uniform or non-uniform thickness to which one or more insulating layers have been applied. Various portions 881-884 of the substrate 895 extend between bend zones 878A-878C. Upon bending or other shaping of the substrate, the substrate portions 881-884 may be arranged in a non-coplanar conformation to yield a substantially rigid upright support structure, such as illustrated in FIG. 10A. Electrical traces (not shown) for multiple LEDs 845 and electrical circuit elements 869 may be patterned on at least one surface of a substrate 895, and the LEDs 845 and circuit elements 869 may be mounted or deposited on or over the substrate 895. Although in one embodiment it is preferred to complete all patterning and mounting steps prior to bending of the substrate, the steps of shaping (e.g., bending) of the substrate 895 and mounting of one or more elements thereon may be performed in any desired order.

FIG. 10A shows the LED light engine 880 arranged within a LED light bulb 810. A base portion 881 of the LED light engine 880 is arranged proximate to the base and contacts 815, 816 of the light bulb 810. The base end 881 of the LED light engine 880 may be used for physical mounting, electrical connections, and or heat conduction. An upright portion 882 of the light engine is arranged along a longitudinal axis of the LED light bulb 810, supporting an angled portion 883 and a transverse cantilever portion 884 on which the LEDs 845 are mounted. Various bends 879A-879C are arranged between the foregoing portion, corresponding to the bend zones 878A-878C illustrated in FIG. 10B. The LED light engine 880 is arranged within an interior volume 831 defined by a cover 830 of the LED light bulb 810. Any of the various LED light bulb covers as disclosed herein may be utilized in connection with the bulb 880.

FIG. 11A illustrates a portion of a substrate 980 including first and second edge connectors 915, 916 arranged for mating with electrical contacts of an external receptacle (e.g., socket or fixture) to supply electric current to a LED light bulb as disclosed herein. The substrate 980, which preferably includes a printed circuit board having various traces thereon (not shown) may include a narrowed end portion 982A to permit insertion thereof into a narrow end of a LED light bulb arranged for mating with an Edison-type threaded socket. A foot contact 915 is arranged at a lower end 911 of the substrate 982, and a lateral contact 916 comprises a fluted edge defining protrusions and grooves arranged to follow the lateral profile of threads of the screw-shaped male base (e.g., threaded surface 927 of bulb 910 illustrated in FIG. 11B) of a LED light bulb arranged to mate with an Edison-type threaded socket. As shown in FIG. 11B, the substrate 980 may be arranged for mounting within a housing 920 of a LED light bulb 910 including an external heatsink 971, a first aperture (e.g. slot) 925 for receiving the foot contact 915 of the substrate 980, and a second aperture (e.g., slot) 926 for receiving the lateral contact 916 of the substrate 980. With the contacts 915, 916 extending through respective apertures in the housing 920, electrical contact may be made directly between the light engine and an electrical receptacle. Various features of the substrate 980 and bulb housing 920 may be integrated with a substrate of a LED light engine and related LED light bulb, respectively, as disclosed herein.

FIGS. 12A-12B illustrate another light engine 1080 arranged for use with a LED light bulb. Various manufacturing steps developed for processing of planar substrate may be applied to the substantially planar substrate 1095. A single carrier may be patterned and processed simultaneously, and then subjected to stamping or other cutting steps to yield multiple individual substrates 1095. Various electrical traces 1091 may be formed in or on one or more surfaces of the substrate 1095 to provide electrical connections for LEDs 1041-1045 and related circuit elements, control elements, and optional sensors 1069A-1069C. The particular substrate shape, panel configuration, number and placement of emitters and control components, and size and placement emitter traces shown in FIG. 12A are for purposes of illustration only; one skilled in the art would recognize upon review of the present disclosure that numerous variants of these and other features are possible. Regarding the electrical traces and control schemes, in one embodiment, groups of emitters may be individually controlled. In another embodiment, each LED may be controlled independently.

Various panels or portions 1081-1087 of the substrate 1095 extend between bend zones 1078A-1078E. Cuts 1099 may be defined between adjacent panels 1082, 1087 and 1083, 1086. A heat conduit portion 1087 having associated mounting elements (e.g., holes or protrusions) 1088 is arranged in conductive thermal communication with the LEDs 1045. Multiple heat conduit portions may be provided; in one embodiment, one or more of the side panels 1082-1084 may be devoid of LED and serve as additional thermal conduit panels. A conduit portion 1087, and optionally the panel 1085 underlying the LEDs 1041-1085 and the panel 1086 underlying the circuit elements 1069A-1069C, may comprise thicker conductive material (e.g., metal gauge) than conductive material with which one or more other panels 1081-1085 are formed, in order to promote enhanced heat transfer and provide a preferential thermal escape path via such panels 1085-1087. One or more panels 1081-1087 of the device, especially including the heat conduit panel 1087 and any panels 1085, 1086 that also may be characterized by enhanced thickness, may include one or more fins. Following various planar processing steps (e.g., deposition of insulating material, formation of electrical traces, mounting or addition of circuit elements 1069A-1069C, and possibly mounting the LEDs 1041-1045 (since such mounting may be performed after cutting and/or shaping steps)), the substrate 1097 may be cut as necessary (e.g., to form cut portions 1099 and/or segregate the substrate from adjacent portions of a carrier) and shaped to form a LED light engine 1080. Upon bending or other shaping of the substrate 1091, the substrate portions 1081-1087 may be arranged in a non-coplanar conformation to yield a substantially rigid upright support structure 1080, such as illustrated in FIG. 12B. In one embodiment, a LED light engine as disclosed herein comprises multiple electrical connectors. An electrical edge connector portion 1090 including multiple contacts may be formed as an extension of one LED support panel 1081. If desired, a portion of the substrate 1095 may be arranged to include edge connectors 911, 915 such as shown in FIG. 11A.

Continuing to refer to FIGS. 12A-12B, one or more panels (e.g., panel 1086) containing electrical control components 1069A-1069C may be folded and placed in an interior portion of a structure bounded by the remaining panels. An end portion 1087A of the heat conduit panel 1087 may be further bent if desired to facilitate mounting. In one embodiment, the end portion 1087A of a heat conduit panel 1087 may be arranged for contacting mounting with one or more LED light bulb heatsink elements (not shown) positioned for exposure to an ambient environment. In one embodiment, a portion of the heatsink panel 1087 (or multiple heatsink panels) may protrude through a housing of a LED light bulb for exposure to an ambient environment.

LED light engines as disclosed herein may be variously utilized with LED light bulb components as disclosed herein, and variously placed and mounted within LED light bulbs.

FIG. 13A illustrates a LED light bulb 1010 according to another embodiment, including a LED light engine 1080 substantially similar to that depicted in FIGS. 12A-12B, occupying a fraction of the length of a base portion 1020 of the light bulb 1010. The base portion may have an associated externally accessible heatsink 1070. The light bulb 1010 includes electrical contacts 1015, 1016 arranged near a base end 1011. A cover 1030 defines an interior volume 1031 in which LEDs 1041-1045 of the LED light engine 1080 are contained. An edge connector portion 1090 extending from one panel 1081 of the LED light engine may mate with an associated structure (e.g., socket) of a base element 1048, and mechanical and thermal connections (e.g., optionally including screws, compression fittings, or other connectors) may further be provided to promote mounting and heat transfer. If desired, one or more electrical circuit elements (e.g., control circuits) may be arranged in the base element 1048, in addition to or instead of providing such circuits in the LED light engine 1080. In one embodiment, a light engine 1080 is mated with (e.g., by insertion into) a prefabricated base element 1048, for making of mechanical, electrical and thermal connections to the base element 1048, and the cover 1031 is affixed to yield a LED light bulb 1010.

FIG. 14 illustrates a LED light bulb 1110 according to another embodiment, including a LED light engine 1180 occupying substantially the entire length of a base portion of the light bulb 1110. The LED light bulb 1110 includes a cover portion 1130 defining an interior volume in which multiple LEDs 1141, 1142, 1145 are contained. The LED light engine 1180 may be inserted into a prefabricated body 1120 including a heatsink 1170, with establishment or immediate provision of mechanical, thermal, and electrical connections. In one embodiment, the LED light engine 1180 includes edge connectors 1115, 1116 arranged for insertion through corresponding apertures disposed in the prefabricated body 1020. In one embodiment, thermal connection between the LED light engine 1180 and a heatsink 1070 associated with the prefabricated body 1120 are made by an insertable connection (alternatively, such connection may be aided by clamping, screwing, or the like). In one embodiment, press-fit or retainably insertable mechanical connection is provided between the LED light engine and the prefabricated body structure 1120. In certain embodiments, at least two, or all three, of the foregoing electrical, mechanical, and thermal connections between a LED light engine and a prefabricated body portion 1120 are made simultaneously by or upon insertion of the LED light engine 1180 into the body portion 1120.

One embodiment of the present invention includes a light fixture with at least one solid state lighting device (e.g., LED light bulb) as disposed herein. In one embodiment, a light fixture includes a plurality of solid state lighting devices. In one embodiment, a light fixture is arranged for recessed mounting in ceiling, wall, or other surface. In another embodiment, a light fixture is arranged for track mounting. A solid state lighting device may be may be permanently mounted to a structure or vehicle, or constitute a manually portable device such as a flashlight.

In one embodiment, an enclosure comprises an enclosed space and at least one solid state lighting device or light fixture as disclosed herein, wherein upon supply of current to a power line, the at least one lighting device illuminates at least one portion of the enclosed space. In one embodiment, a method utilizes a LED light bulb including electrical traces as disclosed herein, and comprises supplying electric current to the plurality of electrical traces to illuminate at least one LED.

In another embodiment, a structure comprises a surface or object and at least one solid state lighting device (e.g., LED light bulb) as disclosed herein, wherein upon supply of current to a power line, the solid state lighting device illuminates at least one portion of the surface or object. In another embodiment, a solid state lighting device as disclosed herein may be used to illuminate an area comprising at least one of the following: a swimming pool, a room, a warehouse, an indicator, a road, a vehicle, a road sign, a billboard, a ship, a toy, an electronic device, a household or industrial appliance, a boat, and aircraft, a stadium, a tree, a window, a yard, and a lamppost.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A light emitting diode (LED) light engine adapted for use in a LED light bulb, the LED light engine comprising:
    a substrate having patterned thereon at least one electrical trace and comprising at least one bend therein arranged to form multiple non-coplanar LED mounting surfaces of a substantially rigid upright support structure, wherein the substrate comprises multiple connectors extending beyond at least some LED mounting surfaces of the multiple non-coplanar LED mounting surfaces, and wherein the connectors are arranged for insertion into multiple recesses or compression fittings of a base element in conductive thermal communication with an externally accessible heatsink arranged between a threaded contact-defining end cap and a light-transmissive cover of a LED light bulb; and
    a plurality of LEDs mounted to LED mounting surfaces of the substrate, arranged in electrical communication with the at least one trace, and arranged in conductive thermal communication with at least portions of the substrate.

2. The LED light engine of claim 1, wherein the at least one electrical trace comprises a plurality of electrical traces.

3. The LED light engine of claim 1, further comprising any of a LED drive circuit element and a LED control circuit element mounted to, defined in, or defined on the substrate.

4. The LED light engine of claim 1, wherein the substrate comprises a metal core printed circuit board.

5. The LED light engine of claim 1, wherein the substrate comprises a stamped metal layer and at least one electrically insulating layer.

6. A LED light bulb comprising the LED light engine of claim 1.

7. The LED light bulb of claim 6, wherein the threaded contact-defining end cap comprises a plurality of electrical contacts arranged to mate with an electrical socket to receive electric current, and wherein the plurality of electrical contacts are arranged to supply electric current to the LED light bulb.

8. The LED light bulb of claim 6, further comprising a cover defining an interior volume, wherein the plurality of LEDs and at least a portion of the substrate are disposed within the interior volume.

9. The LED light bulb of claim 8, wherein the cover comprises any of a diffuser, a lens, and a lumiphoric material.

10. The LED light bulb of claim 8, wherein the cover comprises a plurality of openings to enable air or other fluid to flow between the interior volume and an ambient environment.

11. The LED light bulb of claim 8, wherein at least a portion of the cover comprises a material having visible spectrum transmittance of least about 80% and a thermal conductivity of at least 25 W/(m·° K) at about 25° C., and the cover is in conductive thermal communication the at least one LED.

12. A method utilizing the LED light bulb of claim 6, comprising supplying electric current to the at least one electrical trace to illuminate the at least one LED.

13. A method for forming a LED light engine according to claim 1, the method comprising:
    patterning a substantially planar substrate to define at least one electrical trace for a plurality of light emitting diodes (LEDs);
    mounting a plurality of LEDs to the substrate in electrical communication with the at least one electrical trace; and shaping the substrate to define at least one bend therein to form multiple non-coplanar LED mounting surfaces of a substantially rigid upright support structure for the plurality of LEDs.

14. The method of claim 13, wherein the at least one electrical trace comprises a plurality of electrical traces for the plurality of LEDs and for at least one electrical circuit element associated with the plurality of LEDs.

15. The method of claim 14, wherein the at least one electrical circuit element comprises at least one of a LED drive circuit element and a LED control circuit element, the method further comprising mounting to, defining in, or defining on the substrate the at least one of a LED drive circuit element and a LED control circuit element.

16. The method of claim 13, wherein the substrate comprises a metal core printed circuit board.

17. The method of claim 13, wherein the shaping of the substrate is performed after the mounting of the plurality of LEDs to the substrate.

18. The method of claim 13, wherein the shaping of the substrate includes forming a plurality of non-coplanar LED mounting surfaces adapted to support the plurality of LEDs.

19. The method of claim 13, further comprising arranging a cover that is at least partially transmissive of visible wavelengths over the substantially rigid upright support structure.

20. The method of claim 13, wherein the at least one trace comprises a plurality of electrical traces for a plurality of LEDs and for a plurality of electrical circuit elements, the method further comprising cutting the substrate into a plurality of segments, and shaping the plurality of segments to define at least one bend in each segment to form multiple non-coplanar LED mounting surfaces of a substantially rigid upright support structure.

21. A light emitting diode (LED) light bulb comprising:
a cover defining an interior volume, wherein at least a portion of the cover comprising a material having visible spectrum transmittance of least about 80% and a thermal conductivity of at least 25 W/(m·° K) at about 25° C.; and
a LED light engine according to claim 1, wherein the plurality of LEDs and at least a portion of the substrate are disposed within the interior volume.

22. The LED light bulb of claim 21, wherein said material has a thermal conductivity of at least about 100 W/(m·° K) at about 25° C.

23. The LED light bulb of claim 21, wherein the cover comprises a plurality of fins.

24. The LED light bulb of claim 23, wherein the fins are formed by sintering.

25. The LED light bulb of claim 21, wherein the cover serves as an optical diffuser or at least one lens.

26. The LED light bulb of claim 21, wherein the cover has associated therewith a lumiphoric material arranged to receive emissions from the plurality of LEDs and responsively emit spectral output with a peak wavelength differing from a peak wavelength of emissions of the plurality of LEDs.

27. The LED light bulb of claim 21, wherein substantially all of the cover comprises said material having visible spectrum transmittance of least about 80% and a thermal conductivity of at least 25 W/(m·° K) at about 25° C.

28. The LED light bulb of claim 21, wherein the cover comprises at least one opening to enable air or other fluid to flow between the interior volume and an ambient environment.

29. The LED light bulb of claim 28, further comprising at least one baffle arranged to prevent unobstructed visibility of the plurality of LEDs through the at least one opening.

30. The LED light bulb of claim 29, wherein the at least one baffle is arranged within the interior volume.

31. The LED light bulb of claim 21, wherein the cover comprises a first portion comprising said material having visible spectrum transmittance of least about 80% and a thermal conductivity of at least 25 W/(m·° K), and a second portion having a visible spectrum transmittance of less than about 80% and a thermal conductivity of greater than 25 W/(m·° K), wherein the first portion and the second portion are coupled along an interface arranged to promote conductive heat transfer between the first portion and the second portion.

32. The LED light bulb of claim 21, wherein the at least one LED plurality of LEDs comprises a heat spreader arranged in conductive thermal communication with the plurality of LEDs and in conductive thermal communication with the cover.

33. A light emitting diode (LED) light bulb comprising: a cover defining an interior volume, the cover comprising a material adapted to transmit at least a portion of light in the visible spectrum; a LED light engine according to claim 1, wherein the plurality of LEDs and at least a portion of the substrate are disposed within the interior volume; a base element supporting the substrate and comprising a plurality of electrical conductors in electrical communication with the plurality of LEDs; and a threaded contact-defining end cap including first and second electrical contacts extending from the base element and arranged to receive electric current, wherein the first and second electrical contacts are in electrical communication with the plurality of electrical conductors.

34. The LED light bulb of claim 33, wherein the plurality of LEDs are adapted to emit light having at least one peak wavelength, and the cover comprises at least one lumiphoric material adapted to receive light from the plurality of LEDs and responsively emit light having at least one other peak wavelength that differs from the at least one peak wavelength.

35. The LED light bulb of claim 33, further comprising an externally accessible heatsink including a plurality of fins arranged to dissipate heat generated by the plurality of LEDs.

36. The LED light bulb of claim 33, wherein at least a portion of the cover comprises a material having visible spectrum transmittance of least about 80% and a thermal conductivity of at least 25 W/(m·° K) at about 25° C.

37. The LED light engine of claim 1, wherein at least portions of at least some LED mounting surfaces of the multiple non-coplanar LED mounting surfaces are longitudinally arranged for placement substantially parallel to a longitudinal axis of a LED light bulb.

38. The LED light engine of claim 1, wherein the multiple connectors are arranged to make at least two of: a mechanical connection, a thermal connection, and an electrical connection between the substrate and the base element.

39. The LED light engine of claim 1, wherein the multiple connectors are arranged to make at least one mechanical connection, at least one thermal connection, and at least one electrical connection between the substrate and the base element.

40. The LED light engine of claim 1, wherein the multiple connectors include at least one edge connector.

41. A LED light bulb comprising the LED light engine of claim 1, a base element, a threaded contact-defining end extending from the base element, a light-transmissive cover, and an externally accessible heatsink exposed to an ambient environment and arranged between the threaded contact-defining end and the light-transmissive cover, wherein the multiple connectors are inserted into multiple recesses or compression fittings of the base element.

42. The LED light bulb of claim 41, wherein the cover defines an interior volume, and wherein the plurality of LEDs and at least a portion of the substrate are disposed within the interior volume.

43. The LED light bulb of claim 42, wherein the threaded contact-defining end cap comprises a plurality of electrical contacts arranged to mate with an electrical socket and receive electric current.

44. The LED light bulb of claim 41, wherein the externally accessible heatsink is arranged along an externally accessible surface of the base element.

45. The LED light bulb of claim 41, wherein the externally accessible heatsink includes a plurality of fins.

46. The LED light bulb of claim 41, wherein at least portions of at least some LED mounting surfaces of the multiple non-coplanar LED mounting surfaces are longitudinally arranged for placement substantially parallel to a longitudinal axis of a LED light bulb.

47. The LED light bulb of claim 41, wherein at least one control circuit element arranged to control operation of the plurality of LEDs is arranged in the base element.

48. The LED light bulb of claim 41, wherein at least a portion of the base element comprises a tubular support column.

49. The LED light bulb of claim 48, wherein the support column comprises metal.

50. The LED light bulb of claim 48, wherein at least a portion of the support column is contained within the interior volume of the cover.

51. A light emitting diode (LED) light bulb comprising:
a LED light engine comprising at least one LED mounted to a substrate having patterned thereon at least one electrical trace, the substrate comprising at least one heat conduit portion with which the at least one LED is arranged in conductive thermal communication, wherein the substrate includes at least one bend therein to form a substantially rigid upright support structure for the at least one LED; and
a cover defining an interior volume, wherein the at least one LED is disposed within the interior volume, wherein the cover comprises a plurality of openings to enable air or other fluid to flow between the interior volume and an ambient environment.

52. The LED light bulb of claim 51, further comprising at least one baffle arranged to prevent unobstructed visibility of the at least one LED through the plurality of openings.

53. The LED light bulb of claim 52, wherein the at least one baffle is arranged within the interior volume.

54. The LED light bulb of claim 51, further comprising at least one additional opening defined in a base portion of the light bulb disposed outside the cover.

55. The LED light bulb of claim 54, further comprising a fluid circulation element adapted to cause air or other fluid to flow through the at least one opening and the at least one additional opening.

56. The LED light bulb of claim 51, further comprising a filter element arranged inhibit passage of dust or other particulate matter through the plurality of openings.

57. The LED light bulb of claim 56, further comprising at least one sensor arranged to sense a condition indicative of a need for the filter element to be cleaned or changed.

* * * * *

UNITED STATES PATENT AND TRADEMARK OFFICE
CERTIFICATE OF CORRECTION

| | | |
|---|---|---|
| PATENT NO. | : 8,596,821 B2 | Page 1 of 1 |
| APPLICATION NO. | : 12/796555 | |
| DATED | : December 3, 2013 | |
| INVENTOR(S) | : Brandes et al. | |

It is certified that error appears in the above-identified patent and that said Letters Patent is hereby corrected as shown below:

In the Specification

At col. 17, line 57: "and aircraft" should be -- an aircraft --.

In the Claims:

At col. 18, line 57 (claim 11): "is in thermal communication the at least one LED" should be -- is in thermal communication with the at least one LED --.

At col. 20, lines 13-14 (claim 32): "wherein the at least one LED plurality of LEDs comprises a heat spreader" should be -- wherein the light bulb comprises a heat spreader --.

Signed and Sealed this
Fourth Day of March, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,596,821 B2 | Page 1 of 1 |
| APPLICATION NO. | : 12/796555 | |
| DATED | : December 3, 2013 | |
| INVENTOR(S) | : Brandes et al. | |

It is certified that error appears in the above-identified patent and that said Letters Patent is hereby corrected as shown below:

Title Page, Abstract, line 6: "techiques" should be -- techniques --.

In the Specifications

At col. 10, line 1: "segments or formation of" should be -- segments for formation of --.

At col. 10, line 8: "formation of LED light engine" should be -- formation of a LED light engine --.

At col. 10, line 14: "print circuit board" should be -- printed circuit board --.

At col. 10, line 15: "include a stamped metal layer" should be -- includes a stamped metal layer --.

At col. 10, line 25: "associated with LEDs." should be -- associated with LEDs). --.

At col. 10, line 26: "fabricated from of different metals" should be -- fabricated of different metals --.

At col. 10, line 39: "elements and/associated therewith" should be -- elements associated therewith --.

At col. 11, line 48: "circulation element 50" should be -- circulation element 150 --.

At col. 12, line 15: "light bulb to 10" should be -- light bulb 210 --.

At col. 12, line 35: "receptacle are arranged" should be -- receptacle and are arranged --.

At col. 14, line 39: "between a baffle baffles" should be -- between baffles --.

At col. 15, line 3: "and or" should be -- and/or --.

At col. 15, line 53: "and placement emitter" should be -- and placement of emitter --.

Signed and Sealed this
Twenty-fifth Day of March, 2014

Michelle K. Lee
*Deputy Director of the United States Patent and Trademark Office*